United States Patent
Iwai et al.

(10) Patent No.: US 10,373,898 B2
(45) Date of Patent: Aug. 6, 2019

(54) SEMICONDUCTOR DEVICE AND METHOD OF MANUFACTURING THE SAME

(71) Applicant: Mitsubishi Electric Corporation, Tokyo (JP)

(72) Inventors: Yuji Iwai, Tokyo (JP); Katsumi Miyawaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/447,149

(22) Filed: Mar. 2, 2017

(65) Prior Publication Data

US 2018/0005926 A1    Jan. 4, 2018

(30) Foreign Application Priority Data

Jun. 29, 2016  (JP) .................. 2016-128977

(51) Int. Cl.
*H01L 23/495* (2006.01)
*H01L 23/552* (2006.01)
*H01L 23/00* (2006.01)

(52) U.S. Cl.
CPC .... *H01L 23/49575* (2013.01); *H01L 23/4952* (2013.01); *H01L 23/49531* (2013.01); *H01L 23/49548* (2013.01); *H01L 23/49558* (2013.01); *H01L 23/49582* (2013.01); *H01L 23/552* (2013.01); *H01L 24/32* (2013.01); *H01L 24/48* (2013.01); *H01L 24/49* (2013.01); *H01L 24/73* (2013.01); *H01L 2224/32245* (2013.01); *H01L 2224/48091* (2013.01); *H01L 2224/48137* (2013.01); *H01L 2224/48175* (2013.01); *H01L 2224/48245* (2013.01); *H01L 2224/49171* (2013.01); *H01L 2224/49176* (2013.01); *H01L 2224/73265* (2013.01)

(58) Field of Classification Search
CPC ............ H01L 23/49575; H01L 23/552–23/62
See application file for complete search history.

(56) References Cited

U.S. PATENT DOCUMENTS

2005/0067676 A1   3/2005   Mahadevan et al.
2007/0063322 A1   3/2007   Chow et al.
2009/0115032 A1   5/2009   Camacho et al.
(Continued)

FOREIGN PATENT DOCUMENTS

JP    2007-507108 A    3/2007
JP    2013-197209 A    9/2013
(Continued)

OTHER PUBLICATIONS

An Office Action issued by the Korean Patent Office dated Sep. 10, 2018, which corresponds to Korean Patent Application No. 10-2017-0081633 and is related to U.S. Appl. No. 15/447,149.
(Continued)

*Primary Examiner* — Thanhha S Pham
(74) *Attorney, Agent, or Firm* — Studebaker & Brackett PC

(57) ABSTRACT

A semiconductor device includes a lead frame comprising a first terminal and a second terminal for grounding, a sealing resin which covers the lead frame, an exposed part which is a part of the second terminal and is exposed from the sealing resin and a conductive material which covers the surface of the sealing resin and contacts the second terminal at the exposed part.

11 Claims, 6 Drawing Sheets

(56) References Cited

U.S. PATENT DOCUMENTS

2009/0146268 A1* 6/2009 Huang ............... H01L 21/6835
  257/659
2017/0330838 A1* 11/2017 Mizutani ............. H01L 23/552

FOREIGN PATENT DOCUMENTS

| JP | 2014-183142 A | | 9/2014 |
|----|---------------|---|--------|
| WO | WO-2016/092633 | * | 6/2016 |

OTHER PUBLICATIONS

An Office Action issued by the Japanese Patent Office dated Mar. 19, 2019, which corresponds to Japanese Patent Application No. 2016-128977 and is related to U.S. Appl. No. 15/447,149; with English translation.

* cited by examiner

SEMICONDUCTOR DEVICE AND METHOD OF MANUFACTURING THE SAME

BACKGROUND OF THE INVENTION

Field

The present invention relates to a semiconductor device and a method of manufacturing the same, and more specifically, to the semiconductor device being suitable for use as a high frequency electronic component and the method of manufacturing the same.

Background

Japanese laid-open patent publication No. 2013-197209 discloses a semiconductor device which is sealed by a sealing resin. In this semiconductor device, an electromagnetic wave shield function is provided by covering the surface of the sealing resin with a conductive material. In order to obtain the shield function, the conductive material is connected to a ground.

In the structure shown in Japanese laid-open patent publication No. 2013-197209, a conductor for grounding is disposed in an outer side area of terminals which are comprised by a semiconductor device in order to connect the conductive material and the ground. In this structure, the size of the chip needs to be expanded in order to arrange the conductor. This prevents downsizing of the semiconductor device.

SUMMARY

The present invention is made to solve the above mentioned problem, and a first object of the invention is to obtain a semiconductor device which is sealed by a sealing resin and comprises an electromagnetic wave shield function, the semiconductor device allowing for downsizing.

A second object of the invention is to obtain a method of manufacturing a semiconductor device which is sealed by a sealing resin and comprises an electromagnetic wave shield function, the semiconductor device allowing for downsizing.

The features and advantages of the present invention may be summarized as follows.

According to the first invention, a semiconductor device includes a lead frame comprising a first terminal and a second terminal for grounding, a sealing resin which covers the lead frame, an exposed part which is a part of the second terminal and is exposed from the sealing resin and a conductive material which covers the surface of the sealing resin and contacts the second terminal at the exposed part.

According to the second invention, a method of manufacturing a semiconductor device includes a step for sealing for covering a lead frame comprising a first terminal and a second terminal for grounding by a sealing resin so as to form a exposed part which is exposed from the sealing resin in the second terminal and a step for forming a conductive material for applying the conductive material on the surface of the sealing resin so that the conductive material contacts the second terminal at the exposed part.

Other and further objects, features and advantages of the invention will appear more fully from the following description.

DESCRIPTION OF EMBODIMENTS

Figure 1:
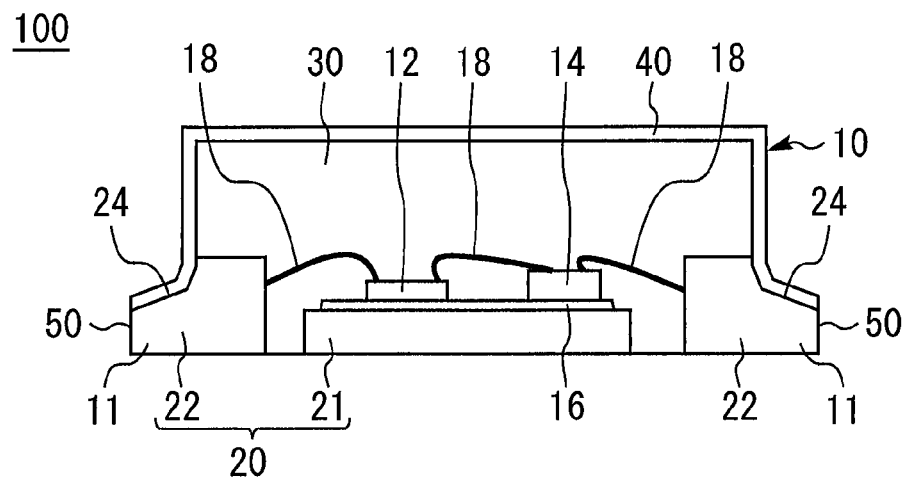
FIG. 1 is a cross sectional view of a semiconductor device according to a first embodiment of the present invention.

A semiconductor device and a method of manufacturing the same according to an embodiment of the present invention will be described with reference to the accompanying drawings. Components identical or corresponding to each other are indicated by the same reference characters, and repeated description of them is avoided in some cases.

First Embodiment

Figure 2:
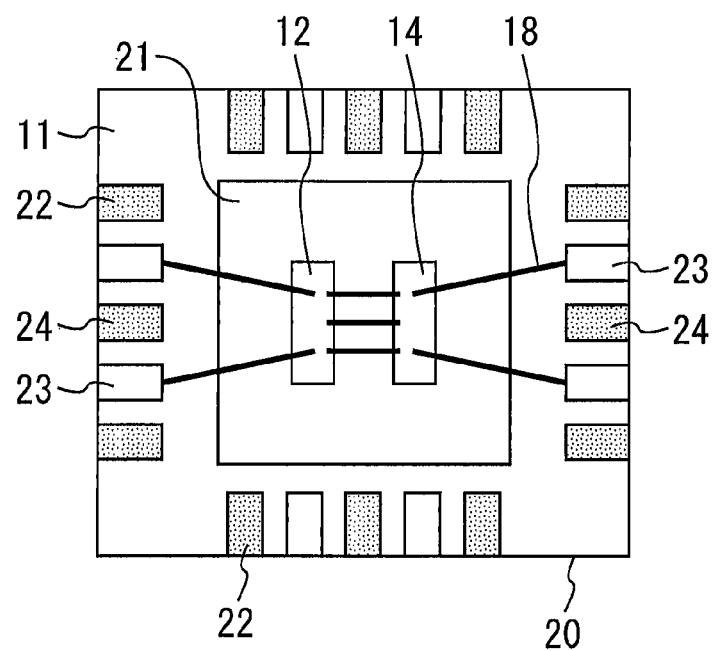
FIG. 2 is a plan view of the semiconductor device according to the first embodiment of the present invention.

FIG. 1 is a cross sectional view of a semiconductor device according to a first embodiment of the present invention. FIG. 2 is a plan view of the semiconductor device according to the first embodiment of the present invention. The semiconductor device 100 according to the present embodiment comprises a lead frame 20. The lead frame 20 comprises a first terminal 23 and a second terminal 22. The first and second terminals 23, 22 are placed in an end 11 of the semiconductor device 100. The second terminal 22 is higher than the first terminal 23. The second terminal 22 is a ground terminal for grounding. Meanwhile, as shown in FIG. 2, although the first and second terminals 23, 22 are disposed alternately in the present embodiment, the first and second terminals 23, 22 may have different arrangement and the different numbers.

The lead frame 20 comprises a die pad 21 in the center for mounting a semiconductor chip 12. The semiconductor chip 12 and a circuit substrate 14 are fixed to the surface of the die pad 21 by a binder 16. The semiconductor chip 12 and the circuit substrate 14 are connected by a wire 18. Also, the semiconductor chip 12 and the circuit substrate 14 are connected by the wire 18 to the first terminal 23. The circuit substrate 14 is a dielectric substrate such as ceramic or glass epoxy on which metal wiring is formed, for example. The circuit substrate 14 may also be a semiconductor substrate such as gallium arsenide, a glass substrate or silicon on which metal wiring is formed. Especially in the case of using the semiconductor substrate, active elements other than active elements formed on the semiconductor chip 12 can be integrated on the circuit substrate 14.

The lead frame 20 is covered by a sealing resin 30. The surface of the sealing resin 30 is covered by a conductive material 40. Meanwhile, the sealing resin 30 and the conductive material 40 are omitted in FIG. 2 for convenience. The lead frame 20, sealing resin 30 and conductive material 40 form a package 10. In the present embodiment, the package 10 is a QFN (Quad Flat No-Lead) package.

Further, a notch is provided in the second terminal 22 at the end 11. For this reason, the second terminal 22 comprises a thin portion at the end 11. The second terminal 22 is higher than the first terminal 23 also in its thin portion at the end 11. The sealing resin 30 comprises a thin wall part 50 at the end 11. At the end 11, the height of the thin wall part 50 is equal to the height of the second terminal 22, and higher than that of the first terminal 23. Therefore, the first terminal 23 will be covered by the sealing resin 30. Also, at the end 11, an exposed part 24 is formed in which a part of the second terminal 22 is exposed from the sealing resin 30. The exposed part 24 and the thin wall part 50 are formed at the end 11 so as to enclose the die pad 21. At the end 11, the conductive material 40 is formed so as to cover the surface of the thin wall part 50 and the exposed part 24. At this time, the second terminal 22 contacts the conductive material 40 in the exposed part 24.

Now, a method of manufacturing the semiconductor device 100 will be described. First, a step for forming the terminals is performed. The step for forming the terminals is a step in which the first and second terminals 23, 22 are formed so that the second terminal 22 is higher than the first terminal 23. In the step for forming the terminals, half etching is performed to the first terminal 23. Thus, the second terminal 22 is higher than the first terminal 23.

Then, the semiconductor chip 12 and the circuit substrate 14 are fixed to the surface of the die pad 21 by the binder 16. Next, the semiconductor chip 12, circuit substrate 14 and first terminal 23 are wired by wires 18. Next, a step for sealing is performed. In the step for sealing, first, the lead frame 20 is covered by the sealing resin 30. This allows for protection of the semiconductor chip 12 against foreign objects and an external force.

Figure 3:
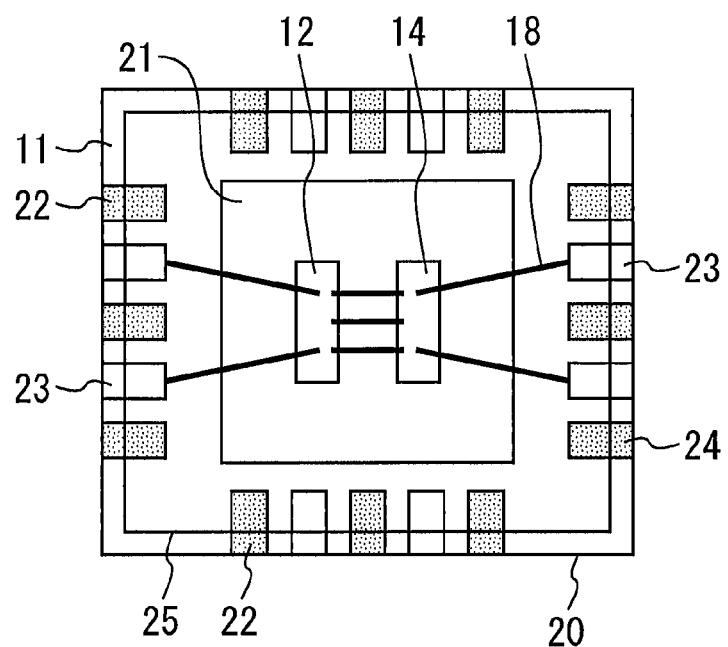
FIG. 3 is a view explaining the method of manufacturing the semiconductor device according to the first embodiment of the present invention.

Next, a step for half dicing is performed. FIG. 3 is a view explaining the method of manufacturing the semiconductor device according to the first embodiment of the present invention. Meanwhile, the sealing resin 30 and the conductive material 40 are omitted in FIG. 3 for convenience. In the step for half dicing, half dicing is performed so as to enclose the semiconductor device 100 at the end 11 of the semiconductor device 100. Here, half dicing means that dicing of the semiconductor device 100 is performed to a depth where the semiconductor device 100 is not cut out. As a result, a notch is provided in the semiconductor device 100 at the outer side of a solid line 25 shown in FIG. 3.

In the present embodiment, half dicing of the semiconductor device 100 is performed to a depth where a part of the sealing resin 30 and a part of the second terminal 22 are cut out while dicing does not reach the first terminal 23. Hence, half dicing keeps the first terminal 23 covered and exposes the second terminal 22 from the sealing resin 30. Also, the thin wall part 50 is provided in the sealing resin 30 through half dicing.

Figure 4A:
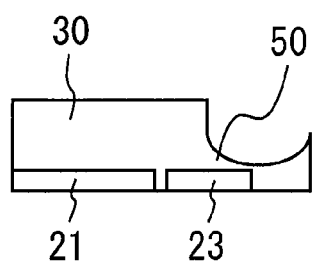
FIG. 4A is a cross sectional view at a first terminal portion, showing a state where half dicing has been performed.

FIG. 4A is a cross sectional view at a first terminal portion, showing a state where half dicing has been performed. In the step for half dicing, the semiconductor device 100 is diced to a depth in which dicing does not reach the surface of the first terminal 23. Therefore, the first terminal 23 is covered by the sealing resin 30 also at the end 11.

Figure 4B:
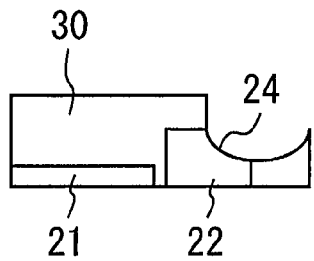
FIG. 4B is a cross sectional view at a second terminal portion, showing the state where half dicing has been performed.

FIG. 4B is a cross sectional view at the second terminal portion, showing the state where half dicing has been performed. In the step for half dicing, a part of the surface and the side of the second terminal 22 is cut out. As a result, an exposed part 24 is formed in which a part of the second terminal 22 is exposed from the sealing resin 30. Accordingly, the exposed part 24 and the thin wall part 50 will be formed so as to enclose the die pad 21 at the end 11 of the semiconductor device 100.

Figure 4C:
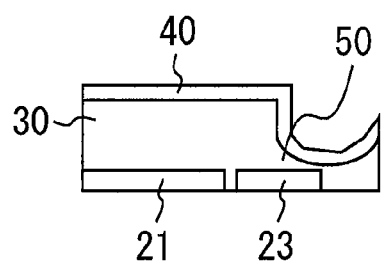
FIG. 4C is a cross sectional view at the first terminal portion, showing a state where a conductive material is formed.
Figure 4D:
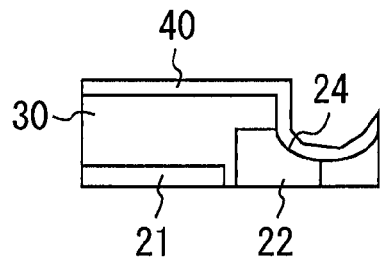
FIG. 4D is a cross sectional view at the second terminal portion, showing the state where the conductive material is formed.

Next, a step for forming the conductive material is performed. In the step for forming the conductive material, the conductive material 40 is applied to the surface of the sealing resin 30 and the exposed part 24. FIG. 4C is a cross sectional view at the first terminal 23 portion, showing a state where the conductive material is formed. The first terminal 23 is covered by the sealing resin 30. Therefore, the first terminal 23 does not contact the conductive material 40. FIG. 4D is a cross sectional view at the second terminal portion, showing the state where the conductive material is formed. The second terminal 22 is exposed from the sealing resin 30 at the exposed part 24. Consequently, the conductive material 40 contacts the second terminal 22 at the exposed part 24. Next, full dicing is performed so as to enclose the semiconductor device 100. As a result, the semiconductor devices 100 are separated into pieces. In the step for forming the conductive material, the conductive material 40 is formed by a spattering method using metal such as Au, Ag, Cu and Nichrome. The conductive material 40 may also be formed by a metal evaporation method using metal such as Au, Ag, Cu and Nichrome. The conductive material 40 may also be formed by a sintering method of hyperfine metal particles such as Ag and Cu. The conductive material 40 may also be formed by plating using Au, Ag, Cu, Pd, etc. The conductive material 40 may also be formed by applying conductive polymers such as a conductive fluorine resin. The conductive material 40 may also be formed by applying a metal powder paste using Ag, Cu, Pd, etc.

In the semiconductor device 100 according to the present embodiment, the surface of the package 10 is covered by the conductive material 40. The conductive material 40 contacts the second terminal 22 at the exposed part 24. The second terminal 22 is a ground terminal for grounding the semiconductor device 100. Thus, when the semiconductor device 100 is implemented, the conductive material 40 is grounded via the second terminal 22. Therefore, the conductive material 40 will comprise an electromagnetic wave shield function.

Further, in the present embodiment, the conductive material 40 is applied also to the surface of the notch which is formed by performing half dicing. Therefore, as shown in FIG. 1, forming the conductive material 40 is allowed also in the side of the package 10. Because of this, the shield function is provided also in the side of the package 10. Consequently, enhancement of the shield function is permitted, as compared to a case where the conductive material 40 is formed only on the top surface of the package. In addition, the first terminal 23 is covered by the sealing resin 30 even after performing the step for half dicing. For this reason, even when the surface of the notch is covered by the conductive material 40, the first terminal 23 and the conductive material 40 will not become shorted.

In a high frequency circuit module, electromagnetic waves which are emitted by a high frequency electronic component implemented inside the package may leak. Also, interference with the high frequency electronic component may occur from electromagnetic waves which intrudes from the outside the package. As a method for suppressing this effect of electromagnetic waves, use of a metal structure package which is mainly composed of metal is conceivable. However, the metal structure package is more expensive than a mold resin sealing package. On the contrary, the package 10 in the present embodiment is a QFN package which is sealed by a mold resin. In the present embodiment, the QFN package which is sealed with a mold resin is covered by the conductive material 40 to obtain the electromagnetic wave shield function. Thus, obtaining the electromagnetic wave shield function is allowed at low cost.

Also, as a method for grounding the conductive material which covers a sealing resin, a structure is conceivable in which a conductor for grounding is arranged in an outer side area of terminals which are comprised by a semiconductor device, thereby connecting the conductor and the conductive material. In this case, the size of the chip needs to be expanded in order to arrange the conductor. Contrary to this, the semiconductor device 100 according to the present invention allows the conductive material 40 and a ground to be connected through the second terminal 22. The second terminal 22 contacts the conductive material 40 at the exposed part 24 which is formed on the surface of the second terminal 22. For this reason, the size of the chip does not need to be expanded in order to ground the conductive material 40. Therefore, an increase of the size of the chip for seeking the shield function can be controlled. This allows for downsizing of the semiconductor device 100.

In the present embodiment, half dicing was performed in the entire periphery of the semiconductor device 100 so as to encompass the semiconductor device 100. As a variation of the present embodiment, an area where half dicing is performed may not be the entire periphery as long as the exposed part 24 which is exposed from the sealing resin 30 is formed in the second terminal 22. For example, half dicing may be performed only in one to three sides of the periphery of the sealing resin 30. In addition, in the present embodiment, the semiconductor chip 12 and the circuit substrate 14 are mounted on the die pad 21. In this regard, the circuit substrate 14 may not be mounted on the die pad 21 as long as the semiconductor chip 12 is mounted thereon. In this case, the exposed part 24 and the thin wall part 50 are formed so as to enclose the semiconductor chip 12. Further, circuit components other than the semiconductor chip 12 and the circuit substrate 14 may be mounted on the die pad 21.

Second Embodiment

Figure 5:
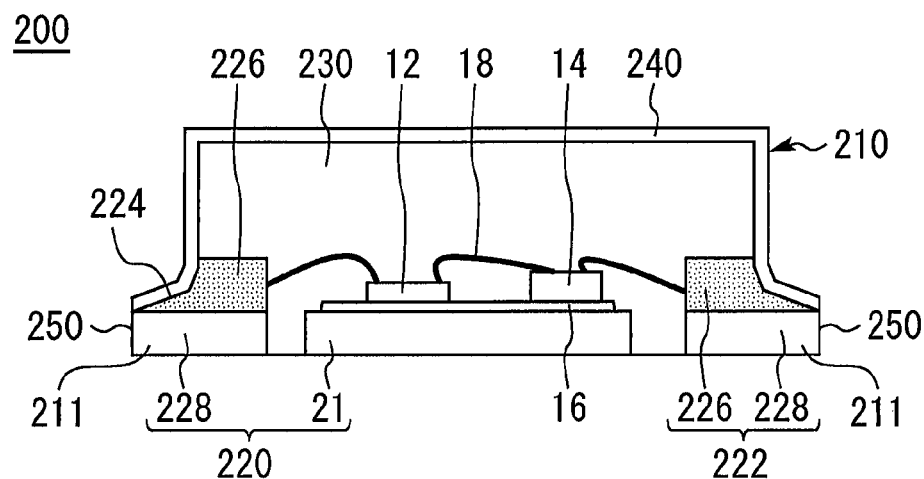
FIG. 5 is a cross sectional view of a semiconductor device according to a second embodiment of the present invention.

FIG. 5 is a cross sectional view of a semiconductor device according to a second embodiment of the present invention. A semiconductor device 200 according to the present embodiment comprises a lead frame 220. The lead frame 220 comprises a first terminal 23 and a second terminal 222. The second terminal 222 comprises a third terminal 228, and a conductive piece 226 which is disposed on the surface of the third terminal 228. The third terminal 228 comprises the same height as that of the first terminal 23. Consequently, the second terminal 222 is higher than the first terminal 23. The third terminal 228 is a ground terminal for grounding.

The lead frame 220 is covered by a sealing resin 230. The sealing resin 230 comprises a thin wall part 250 at an end 211 of the semiconductor device 200. At the end 211, the height of the thin wall part 250 is equal to the height of the second terminal 222, and higher than those of the first terminal 23 and the third terminal 228. Therefore, the first terminal 23 is brought to be covered by the sealing resin 230. Also, at the end 211, an exposed part 224 is formed in which a part of the conductive piece 226 is exposed from the sealing resin 230. At the exposed part 224, the second terminal 222 contacts the conductive material 240.

Figure 6:
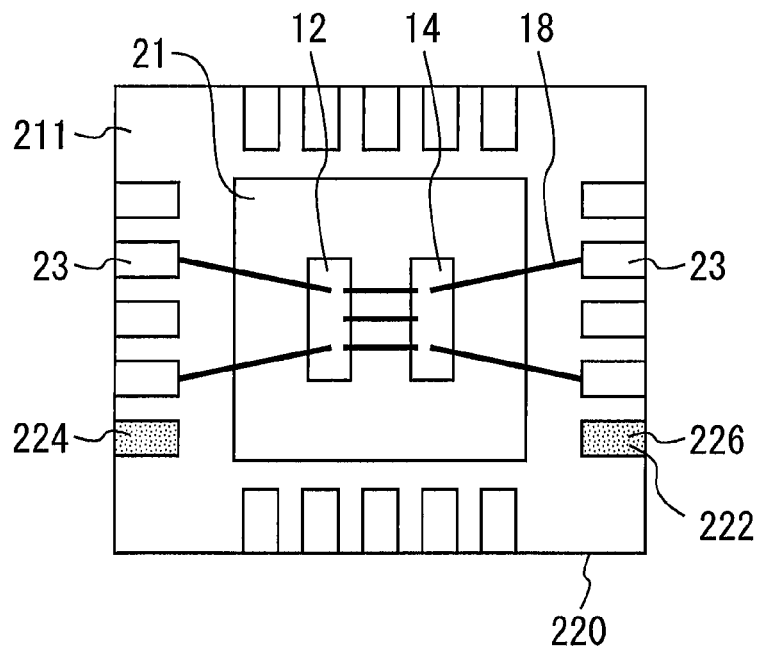
FIG. 6 is a plan view of the semiconductor device according to the second embodiment of the present invention.

FIG. 6 is a plan view of the semiconductor device according to the second embodiment of the present invention. The sealing resin 230 and the conductive material 240 are omitted in FIG. 6 for convenience. While in the present embodiment, the semiconductor device 200 comprises a second terminal 222 one by one in its opposite sides, the second terminals 222 may have different arrangement and the different numbers.

Now, a method of manufacturing the semiconductor device 200 will be described. First, a step for forming the terminals is performed. In the present embodiment, half etching is performed toward the first and third terminals 23, 228 in the step for forming the terminals. As a result, the first and third terminals 23, 228 are formed in the same height. Next, the conductive piece 226 is disposed on the surface of the third terminal 228. The conductive piece 226 is fixed to the surface of the third terminal 228 by a binder. As a result, the second terminal 222 is formed. Here, fixing of the conductive piece 226 can be performed at a step where the semiconductor chip 12 and the circuit substrate 14 are fixed to the die pad 21.

Subsequent processes are the same as those of the first embodiment. Meanwhile, in the step for half dicing, half dicing is performed to a depth where the first terminal 23 is kept covered while the second terminal 222 is exposed, as in the first embodiment. For this reason, in the step for half dicing, a part of the sealing resin 230 and a part of the conductive piece 226 are cut out. Accordingly, the exposed part 224 and the thin wall part 250 are formed so as to enclose the die pad 21 at the end 211 of the semiconductor device 200.

Also in the present embodiment, the top surface of the sealing resin 230 and the surface of the notch are covered by the conductive material 240, as in the first embodiment. When the semiconductor device 200 is implemented, the conductive material 240 is grounded via the conductive piece 226 and the third terminal 228. Thus, forming an electromagnetic wave shield is allowed on the top surface and the side of the package 210.

In the first embodiment, the placement of the second terminal 22 needs to be determined at the time of performing half etching. On the contrary, in the present embodiment, half etching is performed with respect to all terminals. Therefore, the placement of the second terminal 222 does not need to be determined at the time of performing half etching. For the placement of the second terminal 222, any change is allowed by selecting a terminal for fixing the conductive piece 226. Accordingly, it makes it possible to use a common lead frame in which half etching has been performed to all terminals with a plurality of products, and subsequently to change arrangement of the second terminal 222 depending on a product specification.

Third Embodiment

Figure 7:
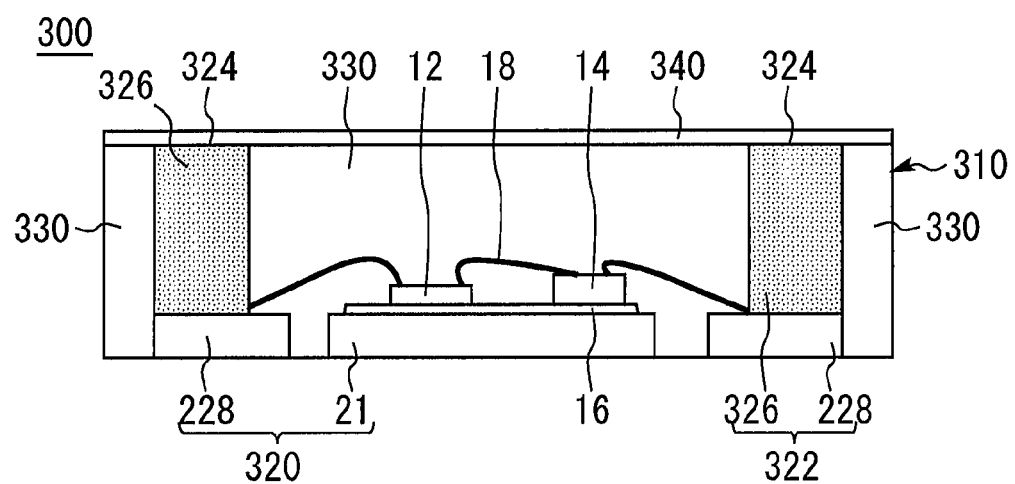
FIG. 7 is a cross sectional view of a semiconductor device according to a third embodiment of the present invention.

FIG. 7 is a cross sectional view of a semiconductor device according to a third embodiment of the present invention. A semiconductor device 300 according to the present embodiment comprises a lead frame 320. The lead frame 320 comprises a first terminal 23 and a second terminal 322. The second terminal 322 comprises a third terminal 228, and a conductive piece 326 which is disposed on the surface of the third terminal 228, similar to the second embodiment.

The lead frame 320 is covered by a sealing resin 330. The sealing resin 330 is formed so as to align with the second terminal 322 in height. Because of this, the surface of the conductive piece 326 is exposed from the surface of the sealing resin 330. Therefore, in the present embodiment, the exposed part 324 is formed with the surface of the conductive piece 326 being exposed from the surface of the sealing resin 330. The conductive material 340 is formed so as to cover the top surface of the sealing resin 330. At this time, the second terminal 322 contacts the conductive material 340 at the exposed part 324.

Now, a method of manufacturing the semiconductor device 300 will be described. The method of manufacturing the semiconductor device 300 is the same as the second embodiment until the step for performing half etching. After performing half etching, the conductive piece 326 is disposed on the surface of the third terminal 228. The conductive piece 326 is fixed to the surface of the first terminal 23 by a binder. As a result, the second terminal 322 is formed.

Next, a step for sealing is performed. In the step for sealing, the lead frame 320 is covered by the sealing resin 330. Here, the height of the conductive piece 326 is set so as to be the same height as the sealing resin 330 at the surface of the third terminal 228. Therefore, the surface of the conductive piece 326 is exposed from the surface of the sealing resin 330. This forms the exposed part 324. Then, a step for forming the conductive material is performed. In the step for forming the conductive material, the top surface of the sealing resin 330 and the exposed part 324 are covered by the conductive material 340. At this time, the conductive material 340 contacts the exposed part 324. Thus, obtaining an electromagnetic wave shield function is allowed.

In the third embodiment, the top surface of the package 310 is covered by the conductive material 340. Thus, obtaining the shield function is allowed on the top surface of the package 310. Also, it makes it possible to use a common lead frame in which half etching has been performed to all terminals with a plurality of products, as in the second embodiment. Further, in the present embodiment, the step for half dicing will not be necessary. Accordingly, reducing assembly cost is allowed.

In the present embodiment, the conductive piece 326 is disposed on the surface of the third terminal 228. To this end, the second terminal 322 is formed so as to be higher than the first terminal 23. As a variation of the present embodiment, the first terminal 23 can be formed so as to be shorter than the second terminal 322 by applying half etching to the first terminal 23, as in the first embodiment. In this case, the lead frame 320 comprises the first and second terminals 23, 322 before performing the step for forming the terminals. Here, the first and second terminals 23, 322 have the same height as the sealing resin 330 before performing the step for forming the terminals.

Fourth Embodiment

Figure 8:
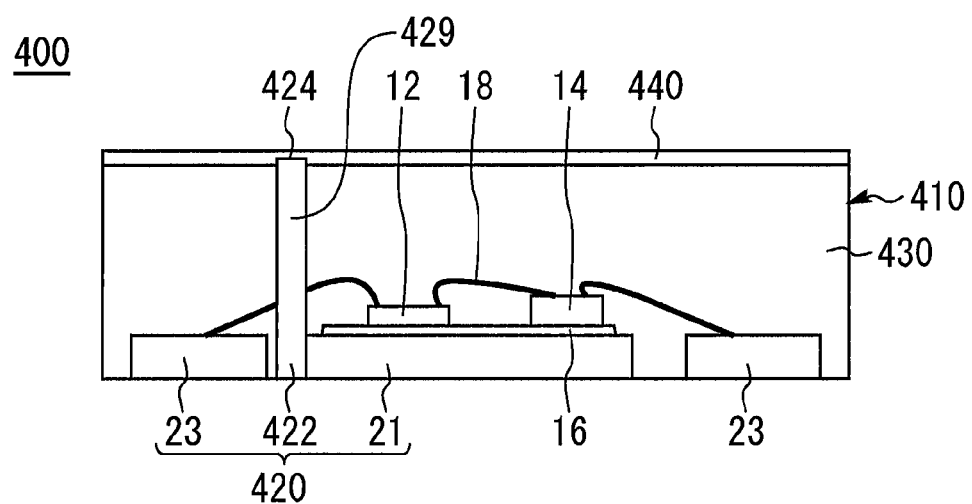
FIG. 8 is a cross sectional view of a semiconductor device according to a fourth embodiment of the present invention.

FIG. 8 is a cross sectional view of a semiconductor device according to a fourth embodiment of the present invention. A semiconductor device 400 according to the present embodiment comprises a lead frame 420. The lead frame 420 comprises a first terminal 23 and a second terminal 422. The second terminal 422 is formed with a pin 429 whose one end is integrated with a die pad 21. The pin 429 is higher than the first terminal 23 and extends vertically to the surface of the die pad 21.

The lead frame 420 is covered by a sealing resin 430. The other end of the pin 429 is exposed from the surface of the sealing resin 430. Therefore, in the present embodiment, the exposed part 424 is formed with the other end of the pin 429 being exposed from the surface of the sealing resin 430. A conductive material 440 is formed so as to cover the surface of the sealing resin 430. At this time, the second terminal 422 contacts the conductive material 440 at the exposed part 424.

Figure 9:
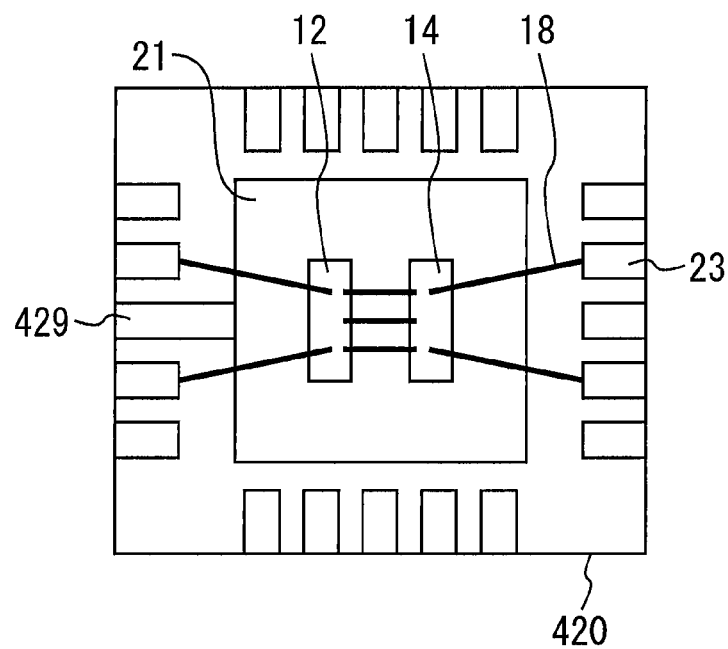
FIG. 9 is a plan view of a lead frame according to the fourth embodiment of the present invention.

Now, a method of manufacturing the semiconductor device 400 will be described. The method of manufacturing the semiconductor device 400 is the same as the second embodiment until the step for performing half etching. FIG. 9 is a plan view of the lead frame according to the fourth embodiment of the present invention. FIG. 9 illustrates the lead frame 420 after performing half etching. The lead frame 420 comprises the first terminal 23 and the pin 429. After performing half etching, the pin 429 is bent so that the pin 429 is oriented vertically to the surface of the die pad 21. The second terminal 422 is thus formed. In the present embodiment, the pin 429 is bent from its root. In this regard, the pin 429 can be bent halfway as long as the other end of the pin 429 is oriented to the surface of the sealing resin 430. Here, the height of the second terminal 422 is adjusted so that the other end of the second terminal 422 is exposed from the surface of the sealing resin 430.

Next, a step for sealing is performed. In the step for sealing, the lead frame 420 is covered by the sealing resin 430. Here, the height of the second terminal 422 has been adjusted so that the other end of the second terminal 422 is exposed from the surface of the sealing resin 430. Because of this, the other end of the second terminal 422 is exposed from the surface of the sealing resin 430. Thus, the exposed part 424 is formed at the other end of the second terminal 422.

Next, a step for forming the conductive material is performed. In the step for forming the conductive material, the top surface of the sealing resin 430 and the exposed part 424 are covered by the conductive material 440. At this time, the conductive material 440 contacts the other end of the second terminal 422. Here, one end of the second terminal 422 extends from the die pad 21. The die pad 21 is connected with a ground when the semiconductor device 400 is implemented. Thus, when the semiconductor device 400 is implemented, the conductive material 440 is grounded via the second terminal 422. This allows an electromagnetic wave shield function to be comprised on the top surface of the package 410.

In the present embodiment, the pin 429 which extends from the die pad 21 is used as the second terminal 422. In the present embodiment, the second terminal 422 is not arranged to the end of the lead frame 420. Therefore, reducing an area for disposing the terminal at the end of the lead frame 420 is permitted. Thus, downsizing of the lead frame 420 is allowed. In addition, because the semiconductor device 400 comprises the pin 429 which extends from the die pad 21, the number of terminals arrangeable in the semiconductor device 400 can be increased.

Fifth Embodiment

Figure 10:
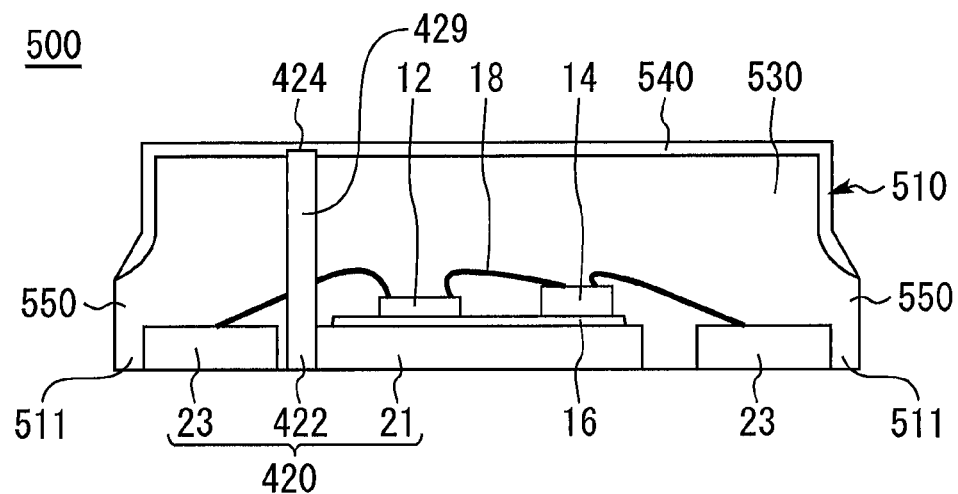
FIG. 10 is a cross sectional view of a semiconductor device according to a fifth embodiment of the present invention.

FIG. 10 is a cross sectional view of a semiconductor device according to a fifth embodiment of the present invention. A configuration of a lead frame 420 according to the present embodiment is similar to that of the fourth embodiment. In the present embodiment, a thin wall part 550 is provided in a sealing resin 530 at an end 511 of the semiconductor device 500 so as to enclose the die pad 21. The thin wall part 550 is higher than the first terminal 23. Therefore, the first terminal 23 is covered by the sealing resin 530 also at the thin wall part 550. The conductive material 540 is formed so as to cover the surface of the sealing resin 530 and the surface of the exposed part 424. At the exposed part 424, the second terminal 422 contacts the conductive material 540.

Now, a method of manufacturing the semiconductor device 500 will be described. The method of manufacturing the semiconductor device 500 is the same as the fourth embodiment until the step for sealing the lead frame 420 with the sealing resin 530. Next, a step for half dicing is performed. In the step for half dicing, half dicing is performed at the end 511 so as to enclose the semiconductor device 500. Half dicing is performed to a depth where the first terminal 23 is kept covered. By the step for half dicing, a part of the surface and the side of the sealing resin 530 are cut out. Accordingly, the thin wall part 550 is formed so as to enclose the die pad 21 at the end 511.

Next, a step for forming the conductive material is performed. In the step for forming the conductive material, the conductive material 540 is applied to the surface of the sealing resin 530 and the exposed part 424. At this time, the conductive material 540 contacts the other end of the second terminal 422. Thus, obtaining an electromagnetic wave shield function is allowed, as in the fourth embodiment.

In the fourth embodiment, the conductive material 440 was provided only on the top surface of the package 410. With regard to this, in the present embodiment, step for half dicing is provided to form a notch at the end 511 so as to enclose the die pad 21. Therefore, the conductive material 540 is formed also on the surface of the notch. For this reason, the package 510 will comprise the conductive material 540 on its top surface and its side. Thus, a shield function is obtained also in the side of the package 510, which allows the shield function to be enhanced as compared with the semiconductor device 400.

Sixth Embodiment

Figure 11:
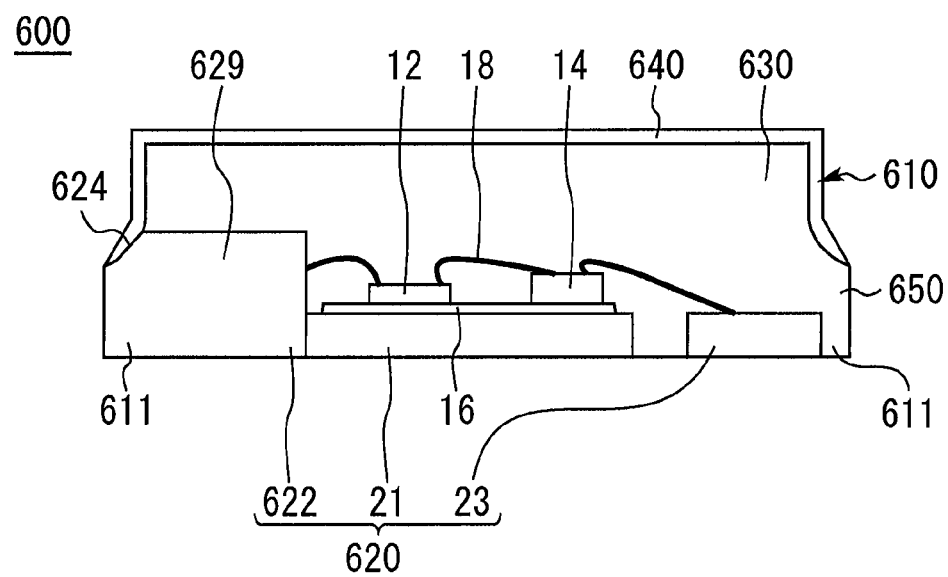
FIG. 11 is a cross sectional view of a semiconductor device according to a sixth embodiment of the present invention.

FIG. 11 is a cross sectional view of a semiconductor device according to a sixth embodiment of the present invention. A semiconductor device 600 according to the present embodiment comprises a lead frame 620. The lead frame 620 comprises a first terminal 23 and a second terminal 622. The second terminal 622 is formed with a pin 629 which is higher than the first terminal 23. The pin 629 is partly integrated with the die pad 21 to be electrically conducted.

A sealing resin 630 comprises a thin wall part 650 at an end 611. At the end 650, the height of the thin wall part 611 is equal to that of the second terminal 622, and higher than that of the first terminal 23. Therefore, the first terminal 23 is brought to be covered by the sealing resin 630. Also, at the end 611, an exposed part 624 is formed in which a part of the second terminal 622 is exposed from the sealing resin 630. The exposed part 624 and the thin wall part 650 are formed at the end 611 so as to enclose the die pad 21. A conductive material 640 is formed so as to cover the surface of the sealing resin 630 and the exposed part 624. At this time, the second terminal 622 contacts the conductive material 640 at the exposed part 624.

Now, a method of manufacturing the semiconductor device 600 will be described. First, a step for forming the terminals is performed. In the step for forming the terminals, half etching is performed to the first terminal 23. With half etching, the first terminal 23 is shorter than the pin 629. Also, in the present embodiment, the pin 629 becomes the second terminal 622. Subsequent processes are the same as those of the first embodiment.

In the present embodiment, the surface of the sealing resin 630 and the exposed part 624 are covered by the conductive material 640. At the exposed part 624, the conductive material 640 contacts the second terminal 622. Here, the second terminal 622 contacts the die pad 21. Thus, it makes it possible to comprise a shield function on the surface of the package 610, as in the fifth embodiment.

The present embodiment comprises a step for half dicing. Thus, a notch is formed at the end 611 so as to enclose the die pad 21. Therefore, the conductive material 640 is formed also on the surface of the notch. For this reason, the package 610 will comprise the conductive material 640 on the top surface and the side thereof. Consequently, the shield function is obtained also on the side of the package 610. In addition, because the semiconductor device 600 comprises the pin 629 which extends from the die pad 21 as in the fourth embodiment, the number of terminals arrangeable in the semiconductor device 600 can be increased. Further, in the present embodiment, a step for bending the pin 629 will be unnecessary. Therefore, an improvement in assemblability is allowed as compared with the fifth embodiment.

In a semiconductor device according to the present invention, a lead frame is covered by a sealing resin. For this reason, a first terminal is covered by the sealing resin. In addition, in a second terminal, an exposed part is formed which is exposed from the sealing resin. Therefore, when the surface of the sealing resin is covered by a conductive material, the conductive material contacts the second terminal at the exposed part. On the other hand, because the first terminal is covered by the sealing resin, the first terminal does not contact the conductive material. Thus, only the second terminal for grounding is allowed to contact the conductive material. This permits to ground the conductive material which becomes an electromagnetic wave shield to obtain the shield function. Here, the semiconductor device according to the present invention allows the conductive material and the ground to be connected on the second terminal. Because of this, a conductor for grounding does not need to be disposed in an outer side area of terminals in order to ground the conductive material. Therefore, downsizing of the semiconductor device is allowed.

In a method of manufacturing a semiconductor device according to the present invention, a lead frame is covered by a sealing resin in a step for sealing. For this reason, a first terminal is covered by the sealing resin. In addition, in a second terminal, an exposed part is formed which is exposed from the sealing resin. Therefore, when the surface of the sealing resin is covered by a conductive material, the conductive material contacts the second terminal at the exposed part. Meanwhile, because the first terminal is covered by the sealing resin, the first terminal does not contact the conductive material. Thus, only the second terminal for grounding is allowed to contact the conductive material. This permits to ground the conductive material which becomes an electromagnetic wave shield to obtain the shield function. Here, the semiconductor device according to the present invention allows the conductive material and the ground to be connected on the second terminal. Because of this, a conductor for grounding does not need to be disposed in an outer side area of terminals in order to ground the conductive material. Therefore, downsizing of the semiconductor device is allowed.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2016-128977 filed on Jun. 29, 2016 including specification, claims, drawings and summary, on which the Convention priority of the present application is based, are incorporated herein by reference in its entirety.

The invention claimed is:

1. A semiconductor device comprising:
 a lead frame comprising at least one first terminal and at least one second terminal for grounding;
 a sealing resin covering the lead frame and defining an end of the semiconductor device, the sealing resin comprising a thin wall part above the at least one first terminal, the thin wall part having a height equal to a height of the at least one second terminal at the end of the semiconductor device;
 an exposed part which is a part of the at least one second terminal and is exposed from the sealing resin; and
 a conductive material which covers the surface of the sealing resin and contacts the at least one second terminal at the exposed part, wherein
 a first notch portion is provided in the at least one second terminal at the end of the semiconductor device, and a second notch portion is provided at the thin wall part and above the at least one first terminal, and
 the conductive material contacts the at least one second terminal in the first notch portion.

2. The semiconductor device according to claim 1, wherein
 the at least one first terminal and the at least one second terminal are arranged at the end of the semiconductor device, and
 the at least one second terminal is higher than the at least one first terminal at the end of the semiconductor device.

3. The semiconductor device according to claim 2, wherein
 the at least one second terminal comprises:
  a third terminal which is comprised by the lead frame and has the same height as the at least one first terminal; and
  a conductive piece which is disposed on the surface of the third terminal.

4. The semiconductor device according to claim 2, wherein
 the lead frame comprises a die pad for mounting a semiconductor chip, and
 the at least one second terminal is electrically conducted with the die pad.

5. The semiconductor device according to claim 2, wherein
 the exposed part and the thin wall part are formed so as to enclose a semiconductor chip, and
 the conductive material covers the surfaces of the exposed part and the thin wall part which enclose the semiconductor chip.

6. The semiconductor device according to claim 1, wherein
 the first notch portion, the second notch portion and a third notch portion provided in a resin portion of the sealing resin between the first notch portion and the second notch portion form a peripheral notch that extends around the entire periphery of the semiconductor device in plan view.

7. The semiconductor device according to claim 6, wherein
 the at least one first terminal includes a plurality of first terminals and the at least one second terminal includes a plurality of second terminals, and
 the plurality of the first terminals and the plurality of the second terminals are arranged at the end of the semiconductor device alternately.

8. The semiconductor device according to claim 1, wherein
 the first notch portion, the second notch portion and a third notch portion provided in a resin portion of the sealing resin between the first notch portion and the second notch portion form a peripheral notch that extends around the periphery of the semiconductor device in plan view.

9. The semiconductor device according to claim 8, wherein
 the at least one first terminal includes a plurality of first terminals and the at least one second terminal includes a plurality of second terminals, and
 the plurality of the first terminals and the plurality of the second terminals are arranged at the end of the semiconductor device alternately.

10. The semiconductor device according to claim 1, wherein
 the first notch portion provides a thin part of the at least one second terminal, and
 a height of the thin part of the at least one second terminal is higher than a height of the at least one first terminal.

11. The semiconductor device according to claim 1, wherein
 a height of the at least one second terminal in the first notch portion is higher than a height of the at least one first terminal.

* * * * *